US007684280B2

(12) United States Patent
Jones et al.

(10) Patent No.: US 7,684,280 B2
(45) Date of Patent: Mar. 23, 2010

(54) HISTOGRAM GENERATION WITH BANKS FOR IMPROVED MEMORY ACCESS PERFORMANCE

(75) Inventors: Michael Frank Jones, Santa Clara, CA (US); Eric Barr Kushnick, Santa Clara, CA (US)

(73) Assignee: Advantest Corporation, Tokyo (JP)

( * ) Notice: Subject to any disclaimer, the term of this patent is extended or adjusted under 35 U.S.C. 154(b) by 239 days.

(21) Appl. No.: 11/876,699

(22) Filed: Oct. 22, 2007

(65) Prior Publication Data
US 2009/0103388 A1    Apr. 23, 2009

(51) Int. Cl.
*G11C 8/00* (2006.01)
(52) U.S. Cl. .............. 365/230.03; 365/189.08; 365/233
(58) Field of Classification Search ............ 365/230.03, 365/233, 185.11, 189.08
See application file for complete search history.

(56) References Cited

U.S. PATENT DOCUMENTS

| 5,666,322 | A  | * | 9/1997  | Conkle ............... 365/230.03 |
| 5,889,714 | A  | * | 3/1999  | Schumann et al. ......... 365/203 |
| 5,974,514 | A  | * | 10/1999 | Andrewartha et al. ....... 711/166 |
| 6,804,162 | B1 | * | 10/2004 | Eldridge et al. ........ 365/230.03 |

* cited by examiner

*Primary Examiner*—Son Dinh
(74) *Attorney, Agent, or Firm*—Morrison & Foerster LLP

(57) ABSTRACT

Dividing memory used for storing histogram data into multiple banks is disclosed to allow for phased RMW cycles. Although the same address lines are provided to each bank, address control logic ensures that each successive RMW cycle is handled by a different bank, so that another RMW cycle can be started in one bank while the previous RMW cycle is still being performed in another bank. By staggering or phasing the starts of the RMW cycles in a wraparound fashion, each histogram bin is spread out over multiple banks, but testing can proceed faster than if only a single bank was used. After the histogram data has been captured, the areas of memory in each bank associated with a particular bin can be added together to compute the total count for that bin.

8 Claims, 4 Drawing Sheets

US 7,684,280 B2

HISTOGRAM GENERATION WITH BANKS FOR IMPROVED MEMORY ACCESS PERFORMANCE

FIELD OF THE INVENTION

This invention relates to the generation of histograms, and more particularly, to dividing a memory for storing histogram data into multiple banks to allow for phased read-modify-write (RMW) cycles.

BACKGROUND OF THE INVENTION

Certain semiconductor devices capable of generating a semi-predictable multi-bit output in response to a known input stimulus can be tested by applying the known stimulus over a fixed period of time, and capturing the number of occurrences of particular multi-bit outputs during that time. Each particular multi-bit output being monitored may be referred to as a "bin," and the number of counts in each bin at the conclusion of the fixed test period can be used to generate a histogram. The histogram can be used in various ways (e.g. numerical analysis) to determine if the device under test (DUT) is acceptable or not, or determine performance parameters.

One such device capable of being tested in the above-described manner is an ADC. An ADC generates a multi-bit output (also referred to herein as a "code") in response to an analog input signal. A common input stimulus used for testing ADCs is a sine wave, which is relatively easily generated in a "clean" manner (substantially free of spurious frequencies). When the sine wave is applied to the input of the ADC, the input signal varies between a minimum and maximum analog voltage level, and the ADC outputs a multi-bit digital signal in accordance with the analog voltage level. Over time, a histogram can be generated indicative of the acceptability of the ADC.

FIG. 1a illustrates an exemplary block diagram of a high level perspective of test system 100 that may be used to test DUTs and generate histograms as described above. It should be emphasized that FIG. 1a is only exemplary, and that many other test system configurations well-understood to those skilled in the art may also be used. In FIG. 1a, modules 102 may be functional units such as a reference generator, a digital pincard, an analog card, a device power supply (DPS), or instruments such as a waveform generator. The physical connections to modules 102 may be obtained through module connection enabler 104 that includes switch matrix network 106. Switch matrix network 106 may include logic, traces, and pins.

System controller 108 is typically the point of interaction for a user. System controller 108 provides a gateway to site controllers 110 and synchronization of the site controllers in a multi-site/multi-DUT environment. A system controller 108 and multiple site controllers 110 may operate in a master-slave configuration. System controller 108 controls the overall system operation and determines that functions that a particular site controller 110 should perform. Each site controller 110 is itself sufficient to test DUT 112. Site controller 110 controls and monitors the operation of various modules 102 within test site 114. Test site 114 is a collection of modules 102 that service the testing of a single DUT 112. Site controller 110 can control one or multiple test sites 114.

As described above, an input stimulus such as a sine wave may be supplied from a reference generator module (one of the modules 102 in test site 114) to DUT 112. A multi-bit output from the DUT can be fed back to another module 102, where a count of each multi-bit output received from the DUT is accumulated.

FIG. 1b illustrates exemplary test site 114 and DUT 112 in greater detail. In FIG. 1b, DUT 112 is an ADC, and module 102_A generates a sine wave that is fed into the input of the ADC. The ADC generates an N-bit digital output, which is connected to the address line of memory 116 within module 102_B. At every sample of the ADC, the N-bit digital output addresses memory 116, and the count stored at that address is read out, modified (incremented by one), and written back to that address (a read-modify-write or RMW cycle).

An inefficiency results from the amount of time it takes to perform a RMW cycle in memory. For example, external DRAM protocols as defined by DRAM manufacturers have a delay period between the time that an address can be presented and when data can be presented, due to pre-charging delays. This latency limits the speed at which the test can be performed. Therefore, performing RMW cycles takes a relatively large number of clock cycles when using DRAM, which in turn slows down the process of gathering of histogram data.

Therefore, there is a need to improve the ability to perform multiple increments to the count of a particular code when gathering histogram data.

SUMMARY OF THE INVENTION

Embodiments of the invention are directed to dividing memory for storing histogram data into multiple banks to allow for phased RMW cycles. Although the same address lines are provided to each bank, address control logic ensures that each successive RMW cycle is handled by a different bank, so that another RMW cycle can be started in one bank while the previous RMW cycle is still being performed in another bank. By staggering or phasing the starts of the RMW cycles in a wraparound fashion, each histogram bin is spread out over multiple banks, but testing can proceed faster than if only a single bank was used. After the histogram data has been captured, the areas of memory in each bank associated with a particular bin can be added together to compute the total count for that bin.

DETAILED DESCRIPTION OF THE PREFERRED EMBODIMENT

In the following description of preferred embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the preferred embodiments of the present invention.

Embodiments of the invention are directed to dividing memory for storing histogram data into multiple banks to allow for phased RMW cycles. Although the same address lines are provided to each bank, address control logic ensures that each successive RMW cycle is handled by a different bank, so that another RMW cycle can be started in one bank while the previous RMW cycle is still being performed in another bank. By staggering or phasing the starts of the RMW cycles in a wraparound fashion, each histogram bin is spread out over multiple banks, but testing can proceed faster than if only a single bank was used. After the histogram data has been captured, the areas of memory in each bank associated with a particular bin can be added together to compute the total count for that bin.

It should be understood that although the present invention may be described herein in the context of testing one or more ADCs being driven with sine waves for purpose of illustration only, embodiments of the present invention are applicable to any device capable of generating a predictable multi-bit output in response to any known input stimulus, and are also applicable to the gathering of histogram data in non-test situations as well.

External DRAM protocols as defined by DRAM manufacturers have a delay period between the time that an address can be presented and when data can be presented, due to pre-charging delays. Therefore, performing RMW cycles takes a relatively large number of clock cycles when using DRAM, which in turn slows down the process of gathering of histogram data.

Figure 1A:
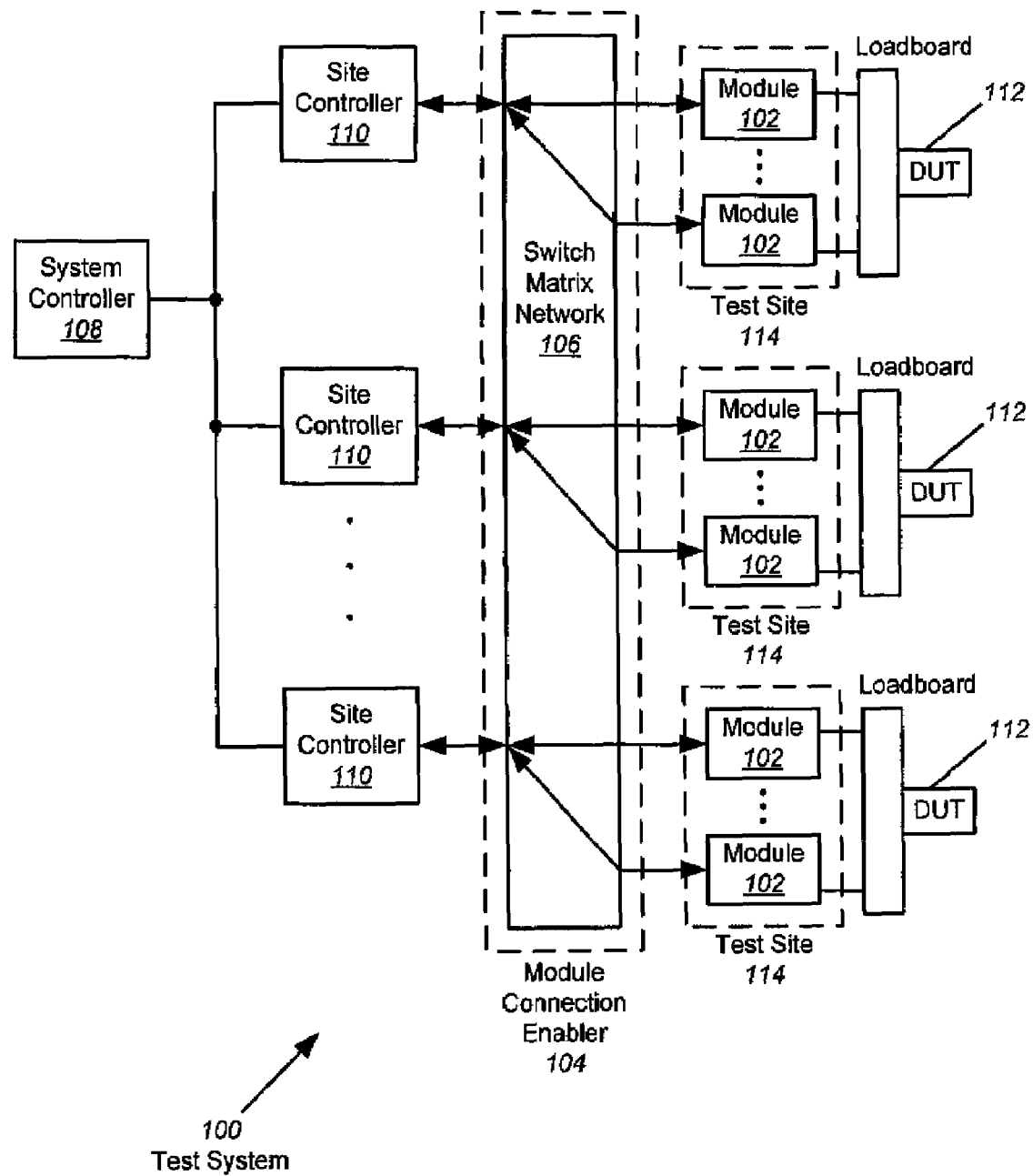
FIG. 1a illustrates an exemplary block diagram of a test system that may be used to test DUTs and generate histograms.
Figure 1B:
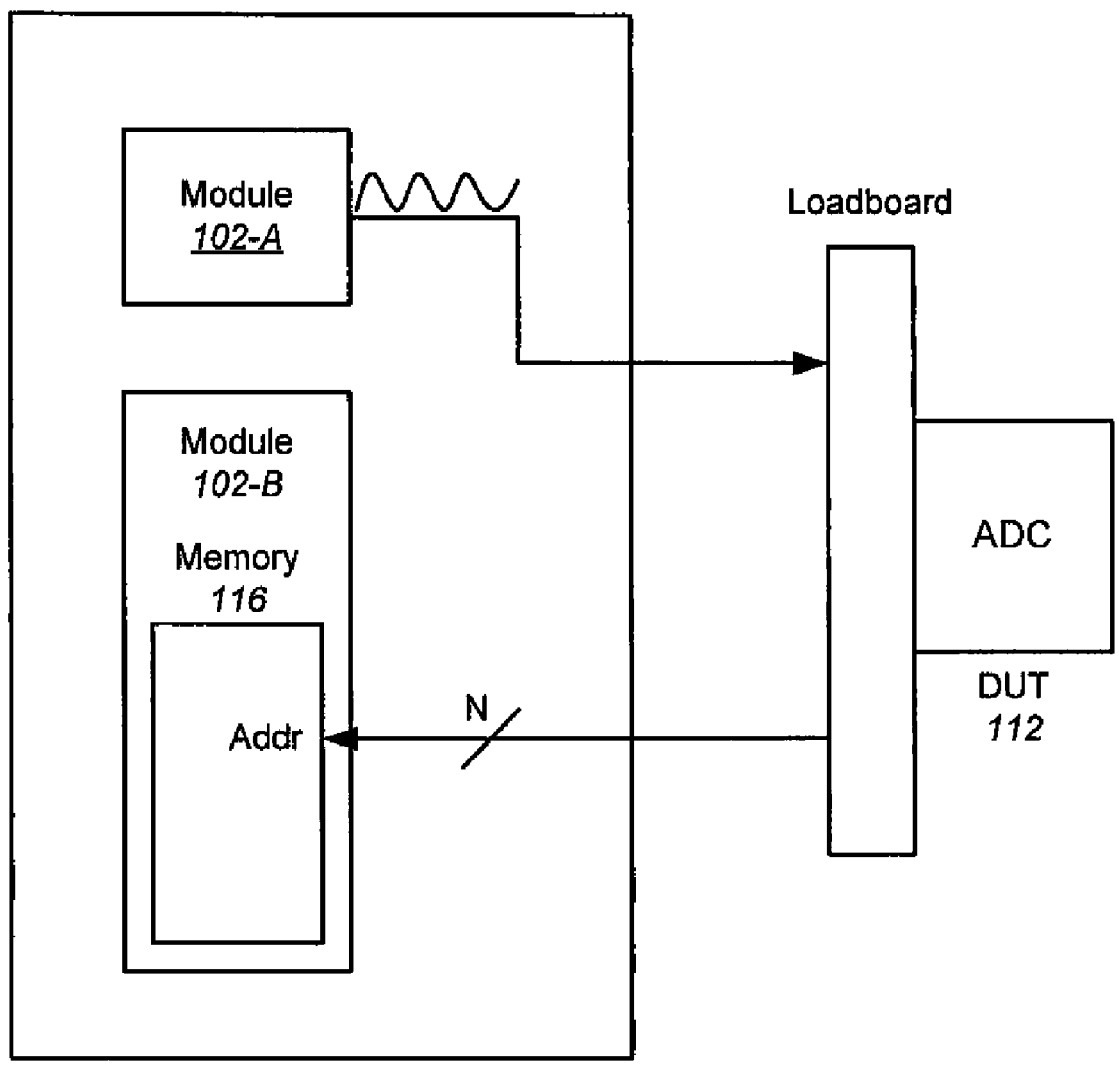
FIG. 1b illustrates an exemplary test site including modules for generating a sine wave and counting the number of occurrences of particular output codes.
Figure 2A:
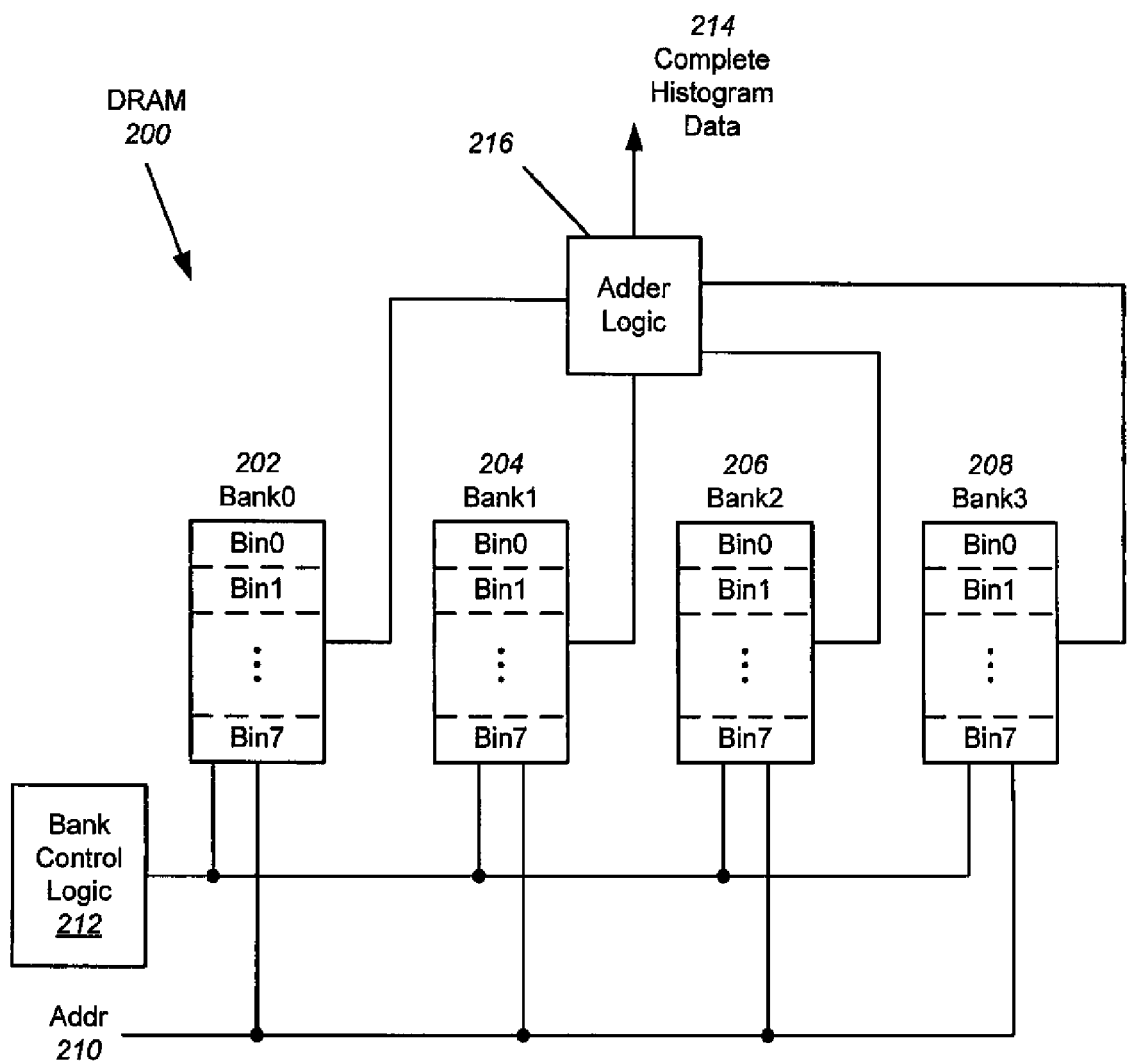
FIG. 2a illustrates an exemplary DRAM divided into multiple banks to allow for phased RMW cycles according to embodiments of the invention.

FIG. 2a illustrates an exemplary DRAM 200 divided into multiple banks 202, 204, 206 and 208 to allow for phased RMW cycles according to embodiments of the invention. Although the same address lines 210 are provided to each bank, address or bank control logic 212 ensures that each successive RMW cycle is handled by a different bank, so that another RMW cycle can be started in one bank while the previous RMW cycle is still being performed in another bank. Bank control logic 212 may multiplex read and/or write enable lines to access each bank consecutively, using logic well-understood by those skilled in the art. By staggering or phasing the starts of the RMW cycles in a wraparound fashion, each histogram bin is spread out over multiple banks, but testing can proceed four times faster than if only a single bank was used (in the specific example of FIG. 2a). In the simplified example of FIG. 2a, each bank contains 8 bins (bin0-bin7). By way of illustration, if codes corresponding to bin0, bin0, bin1, bin2 and bin3 were received from an ADC consecutively, the counts in bin0 of bank 202, bin0 of bank 204, bin1 of bank 206, bin2 of bank 208 and bin3 of bank 202 would be incremented in that order.

It should be understood by those skilled in the art that FIG. 2a is simplified for purposes of clarity, and that various elements such as a clock distribution network to the logic and memories are not shown in the figures. In addition, a mechanism for clearing the memories is needed to clear them prior to the start of a test.

Figure 2B:
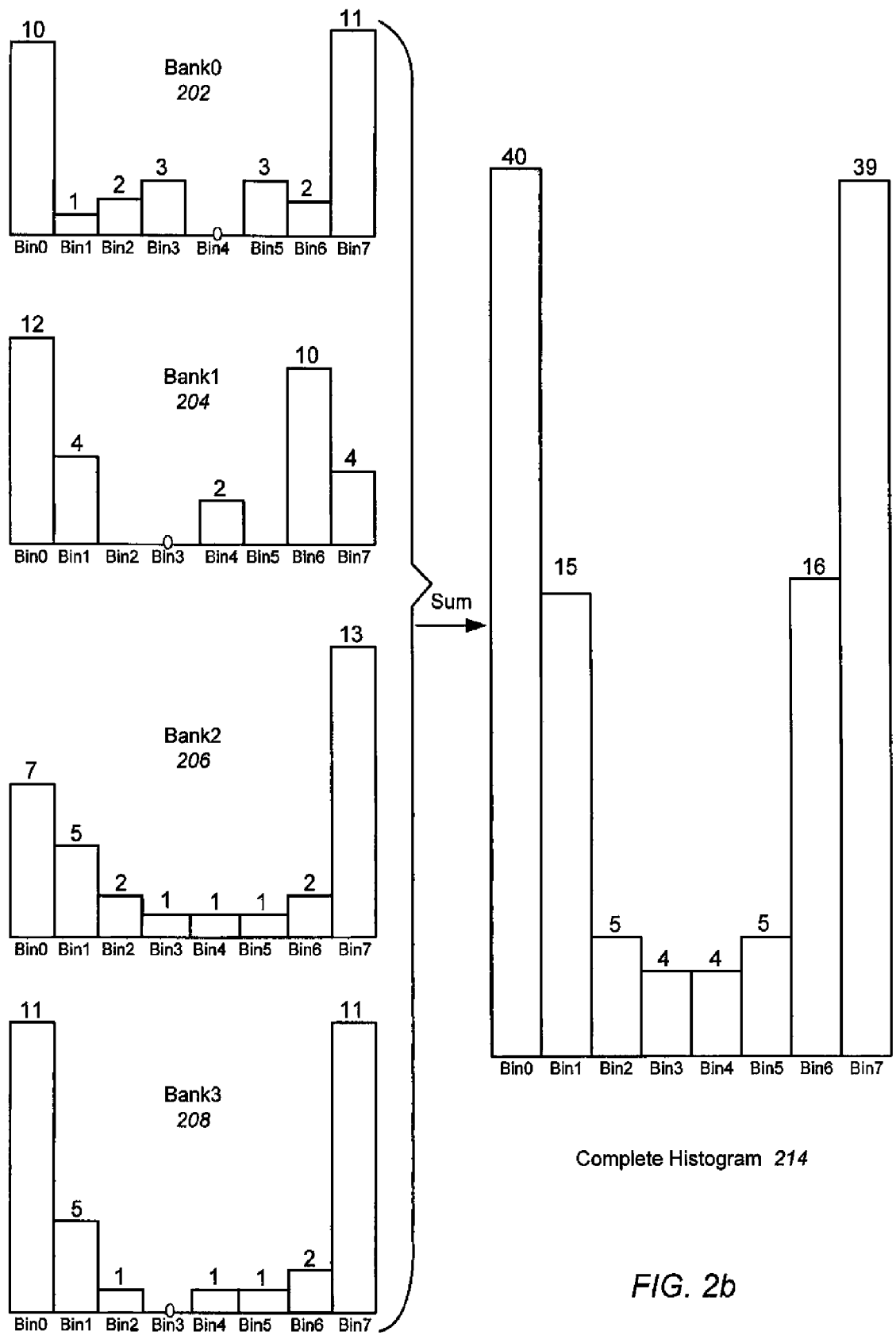
FIG. 2b illustrates exemplary counts stored in the bins of multiple DRAM banks after an exemplary test of an ADC has been completed, and the summing of the bins across the multiple banks to generate complete histogram data according to embodiments of the invention.

FIG. 2b illustrates the counts stored in bin0-bin7 of banks 202, 204, 206 and 208 after an exemplary test of the ADC has been completed. To generate the complete histogram 214 for the test, each of banks 202, 204, 206 and 208 can be added together. In other words, the counts stored at the same address for every bank are added up to obtain the count for a particular bin, and this is repeated for every address to compute the counts for all bins. This addition can be performed by straightforward adder logic 516, well-understood by those skilled in the art.

In general, embodiments of the invention split each histogram bin into N different bins, each of the N bins capable of being accessed consecutively in a faster manner than if the same bin was accessed consecutively. The N bins are then added together in the end. The splitting of bins can be accomplished using standard off-the-shelf DRAM containing multiple banks, such as the DDR2 SDRAM described in the MT47H64M16 data sheet from Micron Technologies, Inc., the contents of which are incorporated by reference herein. Alternatively, separate memories may be used along with phased control logic to enable writing to the separate memories in a staggered fashion.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. An apparatus for enabling phased read-modify-write (RMW) cycles when gathering histogram data, comprising:
   a plurality of memory banks, each memory bank having common address inputs;
   bank control logic coupled to each of the plurality of memory banks, the bank control logic configured for generating staggered control commands to each of the plurality of memory banks to enable a different memory bank from among the plurality of memory banks to start a RMW cycle at each successive clock cycle; and
   adder logic configured for adding counts stored at the same address for every memory bank to obtain the count for a particular bin, and repeating this for every address to compute the counts for all bins.

2. The apparatus of claim 1, wherein the plurality of memory banks are comprised of two or more separate memories.

3. The apparatus of claim 1, wherein the plurality of memory banks are contained within a single package.

4. A test site comprising the apparatus of claim 1.

5. A test system comprising the test site of claim 4.

6. A method for enabling phased read-modify-write (RMW) cycles when gathering histogram data, comprising:
   dividing memory into a plurality of memory banks, each memory bank having common address inputs;
   generating staggered control commands to each of the plurality of memory banks to enable a different memory bank from among the plurality of memory banks to start a RMW cycle at each successive clock cycle; and
   adding counts stored at the same address for every memory bank to obtain the count for a particular bin, and repeating this for every address to compute the counts for all bins.

7. The method of claim 6, further comprising utilizing separate memories to form the plurality of memory banks.

8. The method of claim 6, further comprising utilizing a single memory package containing a plurality of memory banks.

* * * * *